(12) United States Patent
Ito et al.

(10) Patent No.: US 9,541,826 B2
(45) Date of Patent: Jan. 10, 2017

(54) PHOTOCURABLE COMPOSITION AND METHOD OF MANUFACTURING FILM USING THE COMPOSITION

(71) Applicant: CANON KABUSHIKI KAISHA, Tokyo (JP)

(72) Inventors: Toshiki Ito, Kawasaki (JP); Kenichi Iida, Kawasaki (JP); Naoko Matsufuji, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/419,382

(22) PCT Filed: Sep. 20, 2013

(86) PCT No.: PCT/JP2013/076444
§ 371 (c)(1),
(2) Date: Feb. 3, 2015

(87) PCT Pub. No.: WO2014/046304
PCT Pub. Date: Mar. 27, 2014

(65) Prior Publication Data
US 2015/0210790 A1 Jul. 30, 2015

(30) Foreign Application Priority Data

Sep. 24, 2012 (JP) ................. 2012-209327

(51) Int. Cl.
*G03F 7/004* (2006.01)
*G03F 7/027* (2006.01)
(Continued)

(52) U.S. Cl.
CPC .............. *G03F 7/004* (2013.01); *B82Y 30/00* (2013.01); *B82Y 40/00* (2013.01); *C08F 2/48* (2013.01);
(Continued)

(58) Field of Classification Search
CPC .............. G03F 7/004; G03F 7/20; G03F 7/40; G03F 7/38; G03F 7/002; G03F 7/0017; G03F 7/027; G03F 7/0048; B82Y 30/00; B82Y 40/00; H01L 21/0271; H01L 21/76817; H01L 21/0337; C08F 2/50; C09D 7/06; C09D 7/12; C09D 7/125
(Continued)

(56) References Cited

U.S. PATENT DOCUMENTS 5,089,053 A * 2/1992 Chou ................. C11D 17/0013
134/7
5,179,147 A * 1/1993 Jones ..................... G03C 11/08
430/536
(Continued)

FOREIGN PATENT DOCUMENTS

CN 1585809 A 2/2005
CN 101105625 A 1/2008
(Continued)

OTHER PUBLICATIONS

Machine translation JP 2004-103817 (no date).*
(Continued)

*Primary Examiner* — Amanda C Walke
(74) *Attorney, Agent, or Firm* — Fitzpatrick, Cella, Harper & Scinto

(57) ABSTRACT

A photocurable composition of the present invention to be used for manufacturing a film with high productivity is a photocurable composition to be used for manufacturing a film having a predetermined pattern shape by curing the photocurable composition with light under a state where the photocurable composition is brought into contact with a mold having concavo-convex on a surface thereof, the photocurable composition including: a polymerizable compound; a photopolymerization initiator; a photosensitive gas
(Continued)

generating agent for generating a gas through light stimulation; and a gas generation promotor for increasing an aggregation rate of the gas generated from the photosensitive gas generating agent at an interface between the mold and the photocurable composition, in which the gas generation promotor includes a fluorine atom-containing surfactant that is free of a polymerizable substituent.

15 Claims, 1 Drawing Sheet

(51) Int. Cl.
| | |
|---|---|
| G03F 7/38 | (2006.01) |
| G03F 7/40 | (2006.01) |
| G03F 7/20 | (2006.01) |
| B82Y 30/00 | (2011.01) |
| B82Y 40/00 | (2011.01) |
| C09D 7/06 | (2006.01) |
| C08F 2/48 | (2006.01) |
| G03F 7/00 | (2006.01) |
| C09D 4/00 | (2006.01) |
| C08F 22/10 | (2006.01) |
| H05K 3/06 | (2006.01) |
| C08F 222/10 | (2006.01) |
| B29K 105/00 | (2006.01) |
| B29L 11/00 | (2006.01) |
| B29L 31/34 | (2006.01) |

(52) U.S. Cl.
CPC .............. *C08F 22/105* (2013.01); *C09D 4/00* (2013.01); *C09D 7/06* (2013.01); *G03F 7/0002* (2013.01); *G03F 7/0048* (2013.01); *G03F 7/027* (2013.01); *G03F 7/20* (2013.01); *G03F 7/38* (2013.01); *G03F 7/40* (2013.01); *H05K 3/06* (2013.01); *B29K 2105/0005* (2013.01); *B29K 2909/00* (2013.01); *B29L 2011/00* (2013.01); *B29L 2031/3425* (2013.01); *C08F 222/1006* (2013.01)

(58) Field of Classification Search
USPC .... 430/631, 281.1, 322, 325, 329, 330, 331, 430/270.1; 560/182, 184; 562/586; 264/447, 264/293, 40.5; 216/41
See application file for complete search history.

(56) References Cited

U.S. PATENT DOCUMENTS

| | | | | |
|---|---|---|---|---|
| 5,214,216 A * | 5/1993 | Tohzuka | ............... | C08G 65/00 560/182 |
| 5,227,516 A * | 7/1993 | Tohzuka | ............... | C07C 69/708 560/182 |
| 5,945,562 A * | 8/1999 | Aoyama | ................ | C07C 51/29 562/544 |
| 6,004,484 A * | 12/1999 | Faris | ...................... | C09K 3/16 252/500 |
| 8,353,582 B2 * | 1/2013 | Habashi | ................... | B41J 2/155 347/85 |
| 8,444,755 B2 * | 5/2013 | Namba | ................. | B41M 5/506 106/31.86 |
| 8,513,471 B2 * | 8/2013 | Tonelli | ................ | C08G 65/007 508/582 |
| 8,802,570 B2 * | 8/2014 | Iida | ......................... | B05D 5/00 427/277 |
| 2005/0173051 A1 | 8/2005 | Hatai et al. | | |
| 2006/0269715 A1 | 11/2006 | Hatai et al. | | |
| 2007/0065757 A1 * | 3/2007 | Ogino | .................... | B82Y 10/00 430/311 |
| 2008/0116414 A1 * | 5/2008 | Moren | .................. | D06M 13/17 252/8.62 |
| 2009/0263631 A1 * | 10/2009 | Sakamoto | .............. | B82Y 10/00 428/195.1 |
| 2010/0009137 A1 * | 1/2010 | Kodama | ................ | B82Y 10/00 428/195.1 |
| 2011/0003909 A1 * | 1/2011 | Fujita | ..................... | B82Y 10/00 522/182 |
| 2011/0174606 A1 * | 7/2011 | Funk | .................. | H01J 37/32009 204/164 |
| 2011/0232298 A1 * | 9/2011 | Mahendra | ............... | F02C 7/18 60/783 |
| 2011/0236595 A1 * | 9/2011 | Kodama | ................ | B82Y 10/00 427/553 |
| 2013/0002776 A1 * | 1/2013 | Nagashima | .............. | B41M 5/52 347/100 |
| 2014/0349086 A1 * | 11/2014 | Ito | ............................. | C08F 2/24 428/195.1 |
| 2015/0004790 A1 | 1/2015 | Murayama et al. | | |
| 2015/0050426 A1 | 2/2015 | Ito et al. | | |
| 2015/0086755 A1 | 3/2015 | Mihara et al. | | |
| 2015/0109384 A1 * | 4/2015 | Taya | ........................ | C08K 3/04 347/86 |
| 2015/0152208 A1 * | 6/2015 | Mihara | ..................... | C08F 2/44 428/195.1 |
| 2015/0183942 A1 | 7/2015 | Ito et al. | | |
| 2015/0299487 A1 * | 10/2015 | Taya | ...................... | C09D 11/322 347/20 |
| 2016/0009929 A1 * | 1/2016 | Hoshino | .............. | C08G 65/336 428/411.1 |

FOREIGN PATENT DOCUMENTS

| | | | | |
|---|---|---|---|---|
| DE | 102008012895 | * | 9/2009 | .............. C09D 5/08 |
| EP | 338530 A2 | * | 4/1989 | ............. C08G 65/32 |
| JP | 01-308242 A | * | 12/1989 | ............. C07C 43/12 |
| JP | 08-222270 A | * | 8/1996 | ............ H01M 10/40 |
| JP | 2004-103817 A | * | 2/2004 | ........... H01L 21/027 |
| JP | 2008-019292 A | | 1/2008 | |
| JP | 2008-084984 A | | 4/2008 | |
| JP | 2009-051017 A | | 3/2009 | |
| JP | 2010-157613 A | | 7/2010 | |
| JP | 2010-182758 A | | 8/2010 | |
| JP | 2010-262980 A | | 11/2010 | |
| JP | 2011-071299 A | | 4/2011 | |
| JP | 2012-079865 A | | 4/2012 | |
| KR | 10-2010-0127800 A | | 12/2010 | |
| WO | 2013/062068 A1 | | 5/2013 | |
| WO | 2014/046150 A1 | | 3/2014 | |

OTHER PUBLICATIONS

Matthew Colburn et al., "Step and Flash Imprint Lithography: A New Approach to High-Resolution Patterning," Proc. SPIE 3676, Emerging Lithographic Technologies III, pp. 379-389 (1999).
Extended European Search Report in European Application No. 13839651.0 (dated Jan. 27, 2016).
U.S. Appl. No. 14/405,929, filed Dec. 5, 2014, Ito et al.
First Office Action in Chinese Application No. 201380048923.8 (dated Sep. 22, 2015).
Notice of Preliminary Rejection in Korean Application No. 10-2015-7009837 (mailed Apr. 6, 2016).

* cited by examiner

PHOTOCURABLE COMPOSITION AND METHOD OF MANUFACTURING FILM USING THE COMPOSITION

TECHNICAL FIELD

The present invention relates to a photocurable composition and a method of manufacturing a film using the composition.

BACKGROUND ART

A UV nanoimprint method is one method of producing a resist film having a predetermined pattern shape on a substrate such as a substrate to be processed and has, for example, the following manufacturing process including steps (a) to (d):

(a) placing a resist (photocurable composition);
(b) bringing the photocurable composition and a mold having a fine irregular pattern formed on its surface into contact with each other;
(c) irradiating the photocurable composition with light; and
(d) releasing the photocurable composition and the mold from each other after the irradiating.

It should be noted that the pattern shape of the resist film produced through the manufacturing process including the steps (a) to (d) is formed by transferring the concavo-convex of the mold onto the resist film placed on the substrate.

By the way, upon utilization of the UV nanoimprint method, to reduce a force needed for releasing the mold from the resist cured product in the mold release step (step (d)), i.e., a mold release force has been an important issue. This is because of the following reason. When the mold release force is large, problems such as the occurrence of a defect in the pattern and a reduction in positioning accuracy due to the floating of the substrate from a stage arise.

Available as a method of solving the problems is a method proposed in PTL 1. Specifically, the following method has been proposed. A photocurable composition to which a photosensitive gas generating agent that generates a gas such as nitrogen or carbon dioxide through a photoreaction has been added is used. When the method is employed, an interfacial bond between the mold and the photocurable composition is cleaved by the pressure of a gas generated in the light irradiation step, whereby the mold release force is reduced.

However, the method proposed in PTL 1 has involved the following problem. The light irradiation to be performed for generating the gas requires a long time period and hence productivity is low.

CITATION LIST

Patent Literature

PTL 1: Japanese Patent Application Laid-Open No. 2010-262980

Non Patent Literature

NPL 1: SPIE, Vol. 3676, P. 379

SUMMARY OF INVENTION

Technical Problem

The present invention provides a photocurable composition to be used for manufacturing a film with high productivity.

Solution to Problem

The photocurable composition of the present invention is a photocurable composition to be used for manufacturing a film having a predetermined pattern shape by curing the photocurable composition with light under a state where the photocurable composition is brought into contact with a mold having concavo-convex on a surface thereof, the photocurable composition including: a polymerizable compound; a photopolymerization initiator; a photosensitive gas generating agent for generating a gas through light stimulation; and a gas generation promotor for increasing an aggregation rate of the gas generated from the photosensitive gas generating agent at an interface between the mold and the photocurable composition, in which the gas generation promotor includes a fluorine atom-containing surfactant that is free of a polymerizable substituent.

According to the present invention, there can be provided a photocurable composition to be used for manufacturing a film with high productivity.

Further features of the present invention will become apparent from the following description of exemplary embodiments with reference to the attached drawings.

DESCRIPTION OF EMBODIMENTS

Figure 1:
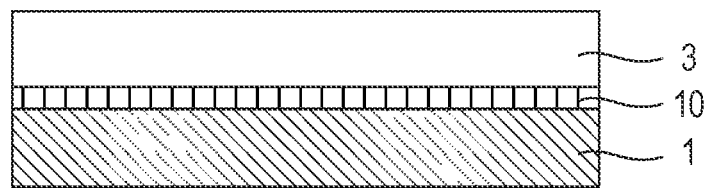
FIG. 1 is a schematic sectional view illustrating the appearance of an interface between a mold and a photocurable composition when the mold is brought into contact with the photocurable composition.

Now, an embodiment of the present invention is described in detail with appropriate reference to drawings, provided that the present invention is not limited to the embodiment to be described below. In addition, in the present invention, embodiments obtained by, for example, appropriately changing and modifying the embodiment to be described below based on the ordinary knowledge of a person skilled in the art to such an extent that the change and modification do not deviate from the gist thereof are also included in the category of the present invention.

In addition, a method of manufacturing a film according to the present invention to be described later is, for example, a method of producing a film involving utilizing a photo-imprint method. Here, upon utilization of the photo-imprint method, a method of forming a film having a pattern having a size of 1 nm to 10 mm is preferred and a method of forming a film having a pattern having a size of about 10 nm to 100 µm is more preferred. A pattern formation technology for producing a film having a pattern (irregular structure) of a nanosize (1 nm to 100 nm) by means of light is generally called a UV nanoimprint method. The present invention utilizes the UV nanoimprint method.

(Photocurable Composition)

A photocurable composition of the present invention is used for manufacturing a film having a predetermined pattern shape by curing the photocurable composition with light under a state where the photocurable composition is brought into contact with a mold having concavo-convex on its surface. In addition, the photocurable composition of the present invention has the following components (A) to (D):
(A) a polymerizable compound;
(B) a photopolymerization initiator;
(C) a photosensitive gas generating agent; and
(D) a gas generation promotor.

Now, each component is described in detail.

<Polymerizable Compound (Component (A))>

In the present invention, the polymerizable compound (component (A)) is a compound that reacts with a polymerizing factor (such as a radical or a cation) generated from the photopolymerization initiator (component (B)). In addition, after the reaction with the polymerizing factor, the polymerizable compound (component (A)) forms a film formed of a polymer compound through a chain reaction (polymerization reaction).

Examples of the polymerizable compound constituting the photocurable composition of the present invention include a radical polymerizable compound and a cation polymerizable compound.

A compound having one or more acryloyl groups or methacryloyl groups is preferred as the radical polymerizable compound. A compound having one or more vinyl ether groups, epoxy groups, or oxetanyl groups is preferred as the cation polymerizable compound.

(Polymerizable Compound (A)-Radical Polymerizable Component)

As monofunctional (meth)acrylic compounds having one acryloyl group or methacryloyl group, there are exemplified, for example, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl(meth)acrylate, 2,4,6-tribromophenoxyethyl(meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxy diethylene glycol (meth)acrylate, polyethylene glycol mono(meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, N,N-dimethylaminopropyl (meth)acrylamide, and the like, but are not limited thereto.

As commercial products of the monofunctional (meth) acrylic compounds, there are exemplified, Aronix M101, M102, M110, M111, M113, M117, M5700, TO-1317, M120, M150, and M156 (all of the above are manufactured by TOAGOSEI CO., LTD); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of the above are manufactured by OSAKA ORGANIC CHEMICAL INDUSTRY LTD.); Light Acrylate BO-A, EC-A, DMP-A, THF-A, HOP-A, HOA-MPE, HOA-MPL, PO-A, P-200A, NP-4EA, and NP-8EA, and Epoxy Ester M-600A (all of the above are manufactured by KYOEISHA CHEMICAL Co., LTD); KAYARAD TC110S, R-564, and R-128H (all of the above are manufactured by NIPPON KAYAKU Co., Ltd.); NK Ester AMP-10G and AMP-20G (both of the above are manufactured by Shin-Nakamura Chemical Co., Ltd.); FA-511A, 512A, and 513A (all of the above are manufactured by Hitachi Chemical Co., Ltd.); PHE, CEA, PHE-2, PHE-4, BR-31, BR-31M, and BR-32 (all of the above are manufactured by Dai-ichi Kogyo Seiyaku Co., Ltd.); VP (manufactured by BASF); ACMO, DMAA, and DMAPAA (all of the above are manufactured by KOHJIN Co., Ltd.), and the like, but are not limited thereto.

Examples of polyfunctional (meth)acrylic compounds each having two or more acryloyl groups or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy)isocyanurate, bis(hydroxymethyl) tricyclodecane di(meth)acrylate, dipentaerythritolpenta (meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl) propane.

Examples of commercial products of the polyfunctional (meth)acrylic compounds include, but not limited to: Upimer UV SA1002 and SA2007 (both of the above are manufactured by Mitsubishi Chemical Corporation); Viscoat #195, #230, #215, #260, #335HP, #295, #300, #360, #700, GPT, and 3PA (all of the above are manufactured by OSAKA ORGANIC CHEMICAL INDUSTRY LTD.); Light Acrylate 4EG-A, 9EG-A, NP-A, DCP-A, BP-4EA, BP-4PA, TMP-A, PE-3A, PE-4A, and DPE-6A (all of the above are manufactured by KYOEISHA CHEMICAL Co., LTD); KAYARAD PET-30, TMPTA, R-604, DPHA, DPCA-20, -30, -60, and -120, and HX-620, D-310, and D-330 (all of the above are manufactured by NIPPON KAYAKU Co., Ltd.); Aronix M208, M210, M215, M220, M240, M305, M309, M310, M315, M325, and M400 (all of the above are manufactured by TOAGOSEI CO., LTD); and Lipoxy VR-77, VR-60, and VR-90 (all of the above are manufactured by SHOWA HIGHPOLYMER CO., LTD.).

One kind of the radical polymerizable compounds listed above may be used alone, or two or more kinds thereof may be used in combination. Note that, in the above-mentioned compound groups, the term "(meth)acrylate" means an acrylate and a methacrylate corresponding thereto. The term "(meth)acryloyl group" means an acryloyl group and a methacryloyl group corresponding thereto. The abbreviation "EO" refers to ethylene oxide, and the term "EO-modified compound" means a compound having a block structure of an ethylene oxide group. Further, the abbreviation "PO" refers to propylene oxide, and the term "PO-modified compound" means a compound having a block structure of a propylene oxide group.

(Polymerizable Compound (A)-Cation Polymerizable Component)

Examples of compounds each having one vinyl ether group include, but not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy polyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxy polyethylene glycol vinyl ether.

Examples of compounds each having two or more vinyl ether groups include, but not limited to: divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, a bisphenol A alkylene oxide divinyl ether, and a bisphenol F alkylene oxide divinyl ether; and polyfunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, and a propylene oxide adduct of dipentaerythritol hexavinyl ether.

Examples of compounds each having one epoxy group include, but not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of compounds each having two or more epoxy groups include, but not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, an epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-metha-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclo hexane carboxylate, methylene bis(3,4-epoxycyclohexane), dicyclopentadiene diepoxide, a di(3,4-epoxycyclohexylmethyl) ether of ethylene glycol, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, and 1,2,5,6-diepoxycyclooctane.

Examples of compounds each having one oxetanyl group include, but not limited to, 3-ethyl-3-hydroxymethyloxetane, 3-(meth)allyloxymethyl-3-ethyloxetane, (3-ethyl-3-oxetanylmethoxy)methylbenzene, 4-fluoro[1-(3-ethyl-3-oxetanylmethoxy)methyl]benzene, 4-methoxy[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl) ether, isobornyloxyethyl (3-ethyl-3-oxetanylmethyl) ether, isobornyl (3-ethyl-3-oxetanylmethyl) ether, 2-ethylhexyl (3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl) ether, tetrahydrofurfuryl (3-ethyl-3-oxetanylmethyl) ether, tetrabromophenyl (3-ethyl-3-oxetanylmethyl) ether, 2-tetrabromophenoxyethyl (3-ethyl-3-oxetanylmethyl) ether, tribromophenyl (3-ethyl-3-oxetanylmethyl) ether, 2-tribromophenoxyethyl (3-ethyl-3-oxetanylmethyl) ether, 2-hydroxyethyl (3-ethyl-3-oxetanylmethyl) ether, 2-hydroxypropyl (3-ethyl-3-oxetanylmethyl) ether, butoxyethyl (3-ethyl-3-oxetanylmethyl) ether, pentachlorophenyl (3-ethyl-3-oxetanylmethyl) ether, pentabromophenyl (3-ethyl-3-oxetanylmethyl) ether, and bornyl (3-ethyl-3-oxetanylmethyl) ether.

Examples of compounds each having two or more oxetanyl groups include, but not limited to, polyfunctionaloxetanes such as 3,7-bis(3-oxetanyl)-5-oxa-nonane, 3,3'-(1,3-(2-methylenyl)propanediyl bis(oxymethylene))bis(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether, dicyclopentenyl bis(3-ethyl-3-oxetanylmethyl) ether, triethylene glycol bis(3-ethyl-3-oxetanylmethyl) ether, tetraethylene glycol bis(3-ethyl-3-oxetanylmethyl) ether, tricyclodecanediyl dimethylene (3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritoltetrakis(3-ethyl-3-oxetanylmethyl) ether, polyethylene glycol bis(3- ethyl-3-oxetanylmethyl) ether, dipentaerythritol hexakis(3-ethyl-3-oxetanylmethyl) ether, dipentaerythritol pentakis(3-ethyl-3-oxetanylmethyl) ether, dipentaerythritol tetrakis(3-ethyl-3-oxetanylmethyl) ether, caprolactone-modified dipentaerythritol hexakis(3-ethyl-3-oxetanylmethyl) ether, caprolactone-modified dipentaerythritol pentakis(3-ethyl-3-oxetanylmethyl) ether, ditrimethylolpropane tetrakis(3-ethyl-3-oxetanylmethyl) ether, EO-modified bisphenol A bis(3-ethyl-3-oxetanylmethyl) ether, PO-modified bisphenol A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether, and E0-modified bisphenol F (3-ethyl-3-oxetanylmethyl) ether.

One kind of the cation polymerizable compounds listed above may be used alone, or two or more kinds thereof may be used in combination. It should be noted that in the above-mentioned compound groups, the abbreviation "EO" represents ethylene oxide and the term "EO-modified compound" means a compound having a block structure of an ethylene oxide group. In addition, the abbreviation "PO" represents propylene oxide and the term "PO-modified compound" means a compound having a block structure of a propylene oxide group. In addition, the term "hydrogenation" means addition of a hydrogen atom to a C=C double bond of a benzene ring or the like.

<Photopolymerization Initiator (Component (B))>

In the present invention, the photopolymerization initiator (component (B)) is a compound for generating the polymerizing factor (such as a radical or a cation) by sensing light having a predetermined wavelength. Specifically, when the polymerizable compound as the component (A) is a radical polymerizable compound, the photopolymerization initiator (component (B)) is a polymerization initiator that generates a radical with light (radiation, e.g., infrared light, visible light, ultraviolet light, far ultraviolet light, an X-ray, or a charged particle ray such as an electron ray). On the other hand, when the polymerizable compound as the component (A) is a cation polymerizable compound, the photopolymerization initiator is a polymerization initiator that generates an acid with light.

Examples of a compound as a radical generating agent include, but not limited to: 2,4,5-triarylimidazole dimers which may have a substituent such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1,2-methyl-1-[4-(methylthio)phenyl]-2-morpholino-prop anon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropyl thioxanthone, and 2-chloro thioxanthone; and xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, and bis(2,6-dimethoxybenzoyl)-2,4,4-trimethylpentylphosphine oxide. It should be noted that one kind of the compounds listed above may be used alone, or two or more kinds thereof may be used in combination.

Examples of commercial products of the photoradical generating agent include, but not limited to, Irgacure 184, 369, 651, 500, 819, 907, 784, and 2959, CGI-1700, -1750, and -1850, CG24-61, and Darocur 1116 and 1173 (all of the above are manufactured by Ciba Japan), Lucirin TPO, LR8893, and LR8970 (all of the above are manufactured by BASF), and Ubecryl P36 (manufactured by UCB).

For example, an onium salt compound, a sulfone compound, a sulfonic acid ester compound, a sulfonimide compound, and a diazomethane compound are given as a compound to be used as the polymerization initiator that generates an acid with light. The compound is not limited to those compounds. In the present invention, of those compounds, an onium salt compound is preferably used.

Examples of the onium salt compound include an iodonium salt, a sulfonium salt, a phosphonium salt, a diazonium salt, an ammonium salt, and a pyridinium salt. Specific examples of the onium salt compound include, but not limited to, bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl)sulfonium 2-trifluoromethylbenzenesulfonate, diphenyl(4-t-butylphenyl)sulfonium pyrenesulfonate, diphenyl(4-t-butylphenyl)sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t-butylphenyl)sulfonium 10-camphorsulfonate, diphenyl(4-t-butylphenyl)sulfonium n-octanesulfonate, tris(4- methoxyphenyl)sulfonium perfluoro-n-butanesulfonate, tris (4-methoxyphenyl)sulfonium trifluoromethanesulfonate, tris(4-methoxyphenyl)sulfonium 2-trifluoromethylbenzenesulfonate, tris(4-methoxyphenyl)sulfonium pyrenesulfonate, tris(4-methoxyphenyl)sulfonium n-dodecylbenzenesulfonate, tris(4-methoxyphenyl)sulfonium p-toluenesulfonate, tris(4-methoxyphenyl)sulfonium benzenesulfonate, tris(4-methoxyphenyl)sulfonium 10-camphorsulfonate, and tris(4-methoxyphenyl)sulfonium n-octanesulfonate.

Examples of the sulfone compound can include β-ketosulfone, β-sulfonylsulfone, and α-diazo compounds thereof. Specific examples of the sulfone compound include, but not limited to, phenacyl phenyl sulfone, mesithyl phenacyl sulfone, bis(phenylsulfonyl)methane, and 4-trisphenacyl sulfone.

Examples of the sulfonic acid ester compound can include an alkyl sulfonic acid ester, a haloalkyl sulfonic acid ester, an aryl sulfonic acid ester, and an iminosulfonate. Specific examples of the sulfonic acid ester compound include, but not limited to, α-methylolbenzoin perfluoro-n-butanesulfonate, α-methylolbenzoin trifluoromethanesulfonate, and α-methylolbenzoin 2-trifluoromethylbenzenesulfonate.

Specific examples of the sulfonimide compounds include, but not limited to,
N-(trifluoromethylsulfonyloxy)succinimide,
N-(trifluoromethylsulfonyloxy)phthalimide,
N-(trifluoromethylsulfonyloxy)diphenylmaleimide,
N-(trifluoromethylsulfonyloxy)bicyclo[2.2.1]hept-5-ene-2,3-dicarboximide,
N-(trifluoromethylsulfonyloxy)-7-oxabicyclo[2.2.1]hept-5-ene-2,3-dicarboximide,
N-(trifluoromethylsulfonyloxy)bicyclo[2.2.1]heptan-5,6-oxy-2,3-dicarboximide,
N-(trifluoromethylsulfonyloxy)naphthylimide,
N-(10-camphorsulfonyloxy)succinimide,
N-(10-camphorsulfonyloxy)phthalimide,
N-(10-camphorsulfonyloxy)diphenylmaleimide,
N-(10-camphorsulfonyloxy)bicyclo[2.2.1]hept-5-ene-2,3-dicarboximide,
N-(10-camphorsulfonyloxy)-7-oxabicyclo[2.2.1]hept-5-ene-2,3-dicarboximide,
N-(10-camphorsulfonyloxy)bicyclo[2.2.1]heptan-5,6-oxy-2,3-dicarboximide,
N-(10-camphorsulfonyloxy)naphthylimide,
N-(4-methylphenylsulfonyloxy)succinimide,
N-(4-methylphenylsulfonyloxyl)phthalimide,
N-(4-methylphenylsulfonyloxy)diphenylmaleimide,
N-(4-methylphenylsulfonyloxyl)bicyclo[2.2.1]hept-5-ene-2,3-dicarboximide,
N-(4-methylphenylsulfonyloxy)-7-oxabicyclo[2.2.1]hept-5-ene-2,3-dicarboximide,
N-(4-methylphenylsulfonyloxyl)bicyclo[2.2.1]heptan-5,6-oxy-2,3-dicarboximide,
N-(4-methylphenylsulfonyloxyl)naphthylimide,
N-(2-trifluoromethylphenylsulfonyloxy)succinimide,
N-(2-trifluoromethylphenylsulfonyloxyl)phthalimide,
N-(2-trifluoromethylphenylsulfonyloxy)diphenylmaleimide,
N-(2-trifluoromethylphenylsulfonyloxyl)bicyclo[2.2.1]hept-5-ene-2,3-dicarboximide,
N-(2-trifluoromethylphenylsulfonyloxy)-7-oxabicyclo[2.2.1]hept-5-ene-2,3-dicarboximide,
N-(2-trifluoromethylphenylsulfonyloxyl)bicyclo[2.2.1]heptan-5,6-oxy-2,3-dicarboximide,
N-(2-trifluoromethylphenylsulfonyloxyl)naphthylimide,
N-(4-fluorophenylsulfonyloxy)succinimide,
N-(4-fluorophenyl)phthalimide,
N-(4-fluorophenylsulfonyloxy)diphenylmaleimide,
N-(4-fluorophenylsulfonyloxyl)bicyclo[2.2.1]hept-5-ene-2,3-dicarboximide,
N-(4-fluorophenylsulfonyloxy)-7-oxabicyclo[2.2.1]hept-5-ene-2,3-dicarboximide,
N-(4-fluorophenylsulfonyloxyl)bicyclo[2.2.1]heptan-5,6-oxy-2,3-dicarboximide, and
N-(4-fluorophenylsulfonyloxyl)naphthylimide.

Specific examples of the diazomethane compound include, but not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyldiazomethane, (cyclohexylsulfonyl)(1,1-dimethylethylsulfonyl)diazomethane, and bis(1,1-dimethylethylsulfonyl)diazomethane.

Of those photoacid generating agents, the onium salt compound is preferred. In the present invention, one kind of the photoacid generating agents may be used alone, or two or more kinds thereof may be used as a mixture.

A compounding ratio of the polymerization initiator as the component (B) is 0.01 wt % or more and 10 wt % or less, preferably 0.1 wt % or more and 7 wt % or less with respect to a total amount of the polymerizable compound as the component (A). If the compounding ratio of the polymerization initiator is less than 0.01 wt %, its curing rate is lowered, thereby leading to a lower reaction efficiency. On the other hand, if the compounding ratio of the polymerization initiator exceeds 10 wt %, the photocurable composition may be inferior in mechanical property of a cured product.

<Photosensitive Gas Generating Agent (Component (C))>

In the present invention, the photosensitive gas generating agent (component (C)) is a substance that generates a gas through the sensing of light such as ultraviolet light (light stimulation). That is, when the photosensitive gas generating agent (component (C)) absorbs specific light, a chemical reaction (elimination reaction) occurs and the gas is generated at the time of the chemical reaction. Examples of the photosensitive gas generating agent include an azo-based compound, a diazonium salt-based compound, an azido-based compound, a diazonaphthoquinone-based compound, a sulfohydrazide-based compound, a hydrazo-based compound, a nitrobenzyl carbamate-based compound, a benzoin carbamate-based compound, and a diazomethanesulfonic acid-based compound. It should be noted that the gas to be generated from the photosensitive gas generating agent is, for example, a carbon dioxide, carbon monoxide, nitrogen, oxygen, or hydrogen, and preferably a carbon dioxide or nitrogen. As a compound generating nitrogen, there are exemplified, for example, an azo-based compound such as 2,2'-azobis-(N-butyl-2-methylpropionamide) (VAm-110, manufactured by WAKO Pure Chemical Industries, Ltd.), a diazonium salt-based compound, and a diazonaphthoquinone-based compound such as a 1,2-naphthoquinonediazide-5-sulfonic acid ester compound. In addition, as a compound generating carbon dioxide, a benzoin carbamate-based compound and a nitrobenzyl carbamate-based compound are given.

The photosensitive gas generating agent as the component (C) is compounded at, for example, 0.1 wt % to 50 wt % with respect to the total amount of the polymerizable compound (component (A)) in the photocurable composition.

The photosensitive gas generating agent (component (C)) is compounded at preferably 0.5 wt % to 20 wt %, more preferably 1 wt % to 15 wt % with respect to the total amount of the polymerizable compound (component (A)). Here, when the compounding ratio of the photosensitive gas generating agent (component (C)) is less than 0.1 wt %, an effect of the present invention may not be sufficiently obtained. In addition, when the compounding ratio of the photosensitive gas generating agent (component (C)) exceeds 50 wt %, the mechanical strength of a film to be manufactured cannot be sufficiently secured and hence a pattern defect occurs in some cases.

<Gas Generation Promotor (Component (D))>

In the present invention, the gas generation promotor (component (D)) is a component to be incorporated into the photocurable composition for aggregating the gas generated from the photosensitive gas generating agent as the component (C) in a light irradiation step to be described later to an interface between the photocurable composition and a mold.

The gas generated from the photosensitive gas generating agent in the light irradiation step is dissolved in the film of the photocurable composition at the beginning. Then, a photoreaction progresses, and when the amount of the dissolved gas exceeds the saturated solubility of the photocurable composition, the gas aggregates (effervesces) at a predetermined place. Here, the aggregation amount of the gas per unit time at the predetermined place is defined as an aggregation rate. In the present invention, the aggregation rate of the gas at the interface between the photocurable composition and the mold is most important.

Here, when the aggregation of the gas occurs at the interface between the mold and the photocurable composition, the photocurable composition is released from the mold at the interface between the mold and the photocurable composition, and hence a mold release force is reduced. However, when the aggregation of the gas occurs in the cured film of the photocurable composition, the release does not occur at the interface between the mold and the photocurable composition, with the result that the mold release force is not reduced.

Here, a method of evaluating the aggregation rate of the gas at the interface between the mold and the photocurable composition is described below. In the photocurable composition, the generation amounts of the gas at the interface between the photocurable composition and the mold after a certain light irradiation time in the case where the gas generation promotor is added to the photocurable composition and in the case where the accelerator is not added are compared with each other. The adoption of the method enables the judgment of the presence or absence of an increase in aggregation rate.

In the present invention, the gas generation promotor for selectively aggregating the gas to a predetermined place is incorporated into the photocurable composition. A time period needed for a mold release operation can be shortened by selectively aggregating the gas generated from the photosensitive gas generating agent to the interface between the photocurable composition and the mold with the gas generation promotor. In addition, the gas generated from the photosensitive gas generating agent can be effectively utilized for reducing the mold release force.

A fluorine atom-containing surfactant that is free of a polymerizable substituent (such as a double bond, a triple bond, or a polar substituent) is specifically used as the gas generation promotor as the component (D).

The fluorine atom-containing surfactant can be represented by any one of the following general formulae (1) to (3).

$$Rf_1\text{-}Rc_1\text{-}X_1 \quad (1)$$

$$Rf_1\text{-}Rc_1\text{-}Rf_2 \quad (2)$$

$$X_1\text{-}Rc_1\text{-}Rf_3\text{-}Rc_2\text{-}X_2 \quad (3)$$

In the formula (1), $Rf_1$ represents a monovalent water-repellent and oil-repellent functional group formed of a fluorine atom and a carbon atom. Specific examples thereof include a linear alkyl group having 2 to 20 carbon atoms and substituted by a fluorine atom such as a perfluoroethyl group, a perfluoropropyl group, a perfluorobutyl group, a perfluoropentyl group, a perfluorohexyl group, a perfluoroheptyl group, a perfluorooctyl group, a perfluorononyl group, or a perfluorodecyl group. The number of carbon atoms is preferably 7 or less from the viewpoint of satisfactory environmental safety.

In the formula (1), $Rc_1$ represents a divalent lipophilic functional group. Specific examples thereof include a polyethylene oxide chain having a repeating unit number of 1 to 100, a polypropylene oxide chain having a repeating unit number of 1 to 100, and an alkyl group that may contain a linear or cyclic structure having 2 to 100 carbon atoms.

In the formula (1), $X_1$ represents a hydroxyl group, a carboxyl group, a sulfo group, an amino group, or an alkoxy group.

In the formula (2), $Rf_1$ and $Rf_2$ each represent a monovalent water-repellent and oil-repellent functional group formed of a fluorine atom and a carbon atom. Specific examples thereof include a linear alkyl group having 2 to 20 carbon atoms and substituted by a fluorine atom such as a perfluoroethyl group, a perfluoropropyl group, a perfluorobutyl group, a perfluoropentyl group, a perfluorohexyl group, a perfluoroheptyl group, a perfluorooctyl group, a perfluorononyl group, or a perfluorodecyl group. The number of carbon atoms is preferably 7 or less from the viewpoint of satisfactory environmental safety. In the formula (2), $Rf_1$ and $Rf_2$ may be identical to or different from each other.

In the formula (2), $Rc_1$ represents a divalent lipophilic functional group. Specific examples thereof include a polyethylene oxide chain having a repeating unit number of 1 to 100, a polypropylene oxide chain having a repeating unit number of 1 to 100, and an alkyl group that may contain a linear or cyclic structure having 2 to 100 carbon atoms.

In the formula (3), $X_1$ and $X_2$ each represent a hydroxyl group, a carboxyl group, a sulfo group, an amino group, or an alkoxy group. In the formula (3), $X_1$ and $X_2$ may be identical to or different from each other.

In the formula (3), $Rf_3$ represents a divalent water-repellent and oil-repellent functional group formed of a fluorine atom and a carbon atom. Specific examples thereof include a linear alkylene group having 2 to 20 carbon atoms and substituted by a fluorine atom such as a perfluoroethylene group, a perfluoropropylene group, a perfluorobutylene group, a perfluoropentylene group, a perfluorohexylene group, a perfluoroheptylene group, a perfluorooctylene group, a perfluorononylene group, or a perfluorodecylene group. The number of carbon atoms is preferably 7 or less from the viewpoint of satisfactory environmental safety.

In the formula (3), $Rc_1$ and $Rc_2$ each represent a divalent lipophilic functional group. Specific examples thereof include a polyethylene oxide chain having a repeating unit number of 1 to 100, a polypropylene oxide chain having a repeating unit number of 1 to 100, and an alkyl group that contains a linear or cyclic structure having 2 to 100 carbon atoms. In the formula (3), $Rc_1$ and $Rc_2$ may be identical to or different from each other.

A commercially available fluorine atom-containing surfactant may be used as long as the surfactant is a compound represented by any one of the general formulae (1) to (3). Examples of the commercially available fluorine atom-containing surfactant include MEGAFACE F-444, TF-2066

(each of which is manufactured by DIC), Fluorad FC-430, FC-431 (each of which is manufactured by Sumitomo 3M Limited), SURFLON S-382 (manufactured by AGC SEIMI CHEMICAL CO., LTD.), EFTOP EF-122A, 122B, 122C, EF-121, EF-126, EF-127, MF-100 (each of which is manufactured by Mitsubishi Materials Electronic Chemicals Co., Ltd.), PF-636, PF-6320, PF-656, PF-6520 (each of which is manufactured by OMNOVA Solutions, Inc.), and UNI-DYNE DS-401, DS-403, DS-451 (each of which is manufactured by DAIKIN INDUSTRIES, LTD).

The inventors of the present invention have made extensive studies, and as a result, have found that the incorporation of the fluorine atom-containing surfactant as the component (D) into the photocurable composition can shorten a time period needed for the light irradiation step to be performed for generating the gas from the photosensitive gas generating agent (component (C)). The foregoing means that the method of manufacturing a film of the present invention has high productivity. Here, the inventors of the present invention have considered the reason why the use of the photocurable composition of the present invention can reduce the mold release force to be as described below.

FIG. 1 is a schematic sectional view illustrating the appearance of the interface between the mold and the photocurable composition when the mold is brought into contact with the photocurable composition.

The gas generation promotor as the component (D) segregates to an interface between a photocurable composition 1 and a mold 3 when the mold and the photocurable composition are brought into contact with each other because the accelerator is also a surfactant. Accordingly, a gas generation layer 10 formed of the gas generation promotor is formed between the mold 3 and the photocurable composition 1.

After the mold 3 and the photocurable composition 1 have been brought into contact with each other, the photocurable composition is irradiated with light through the mold 3. At this time, the polymerizable compound (component (A)) in the photocurable composition 1 polymerizes with a polymerizing factor (such as a radical or a cation) generated from the photopolymerization initiator (component (B)), but the gas generation promotor (component (D)) forming the gas generation layer 10 does not react with the polymerizing factor. Accordingly, the gas generation promotor (component (D)) does not cure even after the light irradiation and is present in the gas generation layer 10 while maintaining the same state (a liquid or a solid) as that before the light irradiation. Here, the gas generation layer 10 in FIG. 1 is a layer mechanically weaker than the mold 3 and a cured film obtained by curing the photocurable composition 1. Accordingly, the gas generated after the curing of the polymerizable compound (component (A)) in the light irradiation step goes away from the photocurable composition 1 to intensively aggregate to the gas generation layer 10 having a lower physical strength than that of the photocurable composition 1. It is assumed that as a result of the foregoing, the physical strength of the gas generation layer 10 itself becomes additionally low by virtue of the aggregation of the gas in the gas generation layer 10 and hence the release of the mold can be easily performed.

In the present invention, one kind of the gas generation promotors as the component (D) may be used alone, or two or more kinds thereof may be used as a mixture.

In addition, in the present invention, the gas generation promotor as the component (D) has only to be incorporated at, for example, 0.001 wt % to 10 wt % with respect to the total weight of the polymerizable compound (component (A)). The accelerator is incorporated at preferably 0.002 wt % to 5 wt %, more preferably 0.005 wt % to 3 wt %. Here, when the compounding ratio with respect to the total weight of the polymerizable compound is less than 0.001 wt %, the effect of the present invention cannot be sufficiently exerted. On the other hand, when the compounding ratio with respect to the total weight of the polymerizable compound exceeds 10 wt %, the filling property of the photocurable composition of the present invention reduces owing to a reduction in surface tension of the photocurable composition or a reduction in contact angle of the photocurable composition with respect to a mold or substrate.

<Other Addition Components>

In addition, the photocurable composition of the present invention may further contain an addition component in addition to the component (A) to component (D). That is, an addition component such as a sensitizer, an antioxidant, a solvent, or a polymer component may be incorporated into the photocurable composition of the present invention in addition to the polymerizable compound, the polymerization initiator, the photosensitive gas generating agent, and the gas generation promotor depending on various purposes to such an extent that the effect of the present invention is not impaired.

The sensitizer is a compound properly added for the purpose of accelerating the polymerization reaction or improving a reaction conversion ratio. Examples of the sensitizer include a hydrogen donor and a sensitizing dye.

The hydrogen donor is a compound that reacts with an initiation radical generated from the polymerization initiator as the component (B) or a radical at a polymerization growth terminal to generate a radical having additionally high reactivity. The hydrogen donor is preferably added when an optical radical generating agent is used as the polymerization initiator.

Specific examples of the hydrogen donor include, but not limited to, N-butylamine, di-n-butylamine, tri-n-butylphosphine, allylthiourea, s-benzylisothiuronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, amine compounds such as N-phenylglycine, 2-mercapto-N-phenylbenzimidazole, and mercapto compounds such as mercaptopropionic acid ester.

The sensitizing dye is a compound that is excited by absorbing light having a specific wavelength to show an interaction with the polymerization initiator as the component (B). It should be noted that the term "interaction" as used herein refers to, for example, the transfer of energy or an electron from the sensitizing dye in an excited state to the polymerization initiator as the component (B).

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a thioxanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, a oxonol-based dye, a cyanine-based dye, a rhodamine-based dye, and a pyrylium salt-based dye.

One kind of the sensitizers may be used alone or two or more kinds thereof may be used as a mixture.

In the photocurable composition of the present invention, the content of the sensitizer is preferably 0 wt % to 20 wt %, more preferably 0.1 wt % to 5.0 wt %, still more preferably 0.2 wt % to 2.0 wt % with respect to the total amount of the polymerizable compound as the component (A). When the content of the sensitizer is set to at least 0.1 wt % or more, an effect of the sensitizer can be expressed in an additionally effective fashion. In addition, when the content of the sensitizer is set to 5.0 wt % or less, a polymer compound constituting a photo-cured product to be produced has a sufficiently high molecular weight, and its dissolution failure and the deterioration of its storage stability can be suppressed.

<Temperature at Time of Compounding of Photocurable Composition>

The preparation of the photocurable composition by the mixing and dissolution of a reagent and a solvent is performed under a predetermined temperature condition. Specifically, the preparation is performed at a temperature in the range of 0° C. to 100° C.

<Viscosity of Photocurable Composition>

The viscosity of the photocurable composition of the present invention is preferably 1 cP to 100 cP, more preferably 3 cP to 50 cP, still more preferably 3 cP to 20 cP at 23° C. in a mixture of the components except the solvent. In the case where the viscosity of the photocurable composition is higher than 100 cP, a long time period may be needed for filling the photocurable composition into a recessed portion out of fine patterns on a mold when the composition is brought into contact with the mold, or a pattern defect may occur owing to a failure in the filling. On the other hand, in the case where the viscosity is lower than 1 cP, application unevenness may occur upon application of the photocurable composition or the photocurable composition may flow out of an end portion of the mold when the photocurable composition is brought into contact with the mold.

<Surface Tension of Photocurable Composition>

The photocurable composition of the present invention has a surface tension at 23° C. of preferably from 5 mN/m to 70 mN/m, more preferably from 7 mN/m to 35 mN/m, still more preferably from 10 mN/m to 32 mN/m in a mixture of components except a solvent. Here, if the surface tension is less than 5 mN/m, when the photocurable composition is brought into contact with a mold, it requires a long time for the composition to fill a recessed portion out of fine patterns on the mold. On the other hand, when the surface tension is more than 70 mN/m, the surface smoothness becomes low.

<Impurities Such as Particle Included in Photocurable Composition>

Impurities are desirably removed from the photocurable composition of the present invention to the extent possible. For example, in order that the defect of a pattern may be prevented from occurring owing to unprepared appearance of concavo-convex in a photo-cured product due to a particle included in the photocurable composition, impurities such as the particle are desirably removed. Specifically, it is preferred that the respective components in the photocurable composition be mixed and then the mixture be filtered with a filter having a pore diameter of, for example, 0.001 µm to 5.0 µm. It is more preferred that the filtration with the filter be performed in multiple stages or be repeated multiple times. In addition, the filtered liquid may be filtered again. A filter made of, for example, a polyethylene resin, polypropylene resin, fluororesin, or nylon resin can be used as the filter to be used in the filtration. However, the filter is not particularly limited thereto.

It should be noted that, upon use of the photocurable composition of the present invention for the manufacture of a semiconductor integrated circuit, the amount of a metal impurity to be included in the composition is preferably reduced to the extent possible in order that the operation of a product may not be inhibited. Accordingly, in the photocurable composition of the present invention, the concentration of the metal impurity that can be incorporated into the composition is set to preferably 10 ppm or less, more preferably 100 ppb or less.

(Method of Forming Film)

Figure 2A:
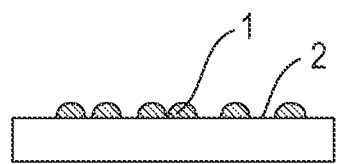
FIGS. 2A, 2B, 2C, 2D, 2E, 2F, and 2G are schematic sectional views illustrating an example of an embodiment in a method of manufacturing a film of the present invention.
Figure 2D:
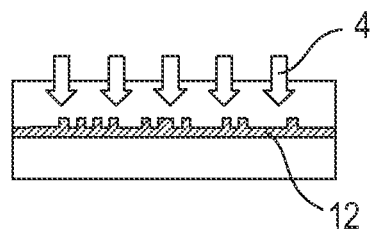
Figure 2B:
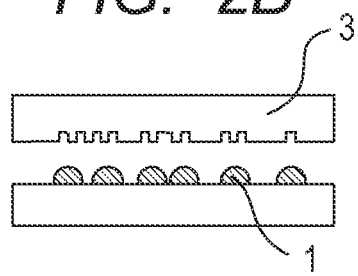
Figure 2E:
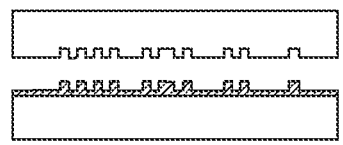
Figure 2C:
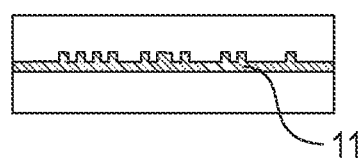
Figure 2F:
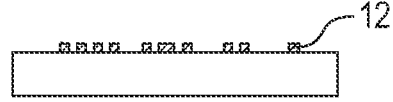
Figure 2G:
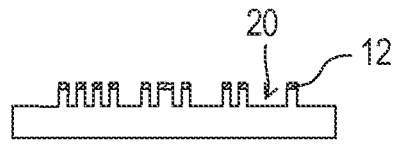

Next, a method of forming a film of the present invention is described. FIGS. 2A to 2G are schematic sectional views illustrating an example of an embodiment in the method of manufacturing a film of the present invention. A manufacturing process illustrated in FIGS. 2A to 2G is a manufacturing process formed of steps described in the following sections (1) to (5) or (6):
(1) an applying step (FIG. 2A);
(2) a contact step (FIGS. 2B and 2C);
(3) a light irradiation step (FIG. 2D);
(4) a mold release step (FIG. 2E);
(5) a remaining film removal step (FIG. 2F); and
(6) a substrate processing step (FIG. 2G).

In the manufacturing process, the remaining film removal step (FIG. 2F) is the step of removing a film (remaining film) remaining in a recessed portion of the photocurable composition through etching after the mold release step (FIG. 2E) to expose the surface of a substrate 2 to be processed in the recessed portion of a pattern. The remaining film removal step (FIG. 2F) is desirably performed upon production of an optical element or an electronic component through the utilization of the manufacturing process.

In the present invention, the surface of a mold in contact with the photocurable composition in the contact step is preferably quartz.

In addition, in the present invention, the light irradiation step is preferably the step of irradiating the photocurable composition with light through the mold and the mold to be used has concavo-convex on its surface. The use of the mold can form a film having a pattern shape corresponding to the concavo-convex provided on the surface of the mold.

Through the steps described in the sections (1) to (6) (or the steps described in the sections (1) to (5)), a photo-cured product 12 and an electronic component (electronic device) or optical component having the photo-cured product 12 can be obtained from the photocurable composition 1. Hereinafter, details about the respective steps are described.

<Placing Step (FIG. 2A)>

First, the photocurable composition 1 is placed (applied) on the substrate 2 to form an applied film (FIG. 2A). The term "photocurable composition" as used herein refers to the photocurable composition of the present invention.

A silicon wafer is generally used for the substrate to be processed corresponding to the substrate 2, but a material for the substrate is not limited to this. In addition to the silicon wafer, there may be used a material arbitrarily selected from any known materials for a substrate of a semiconductor device such as aluminum, a titanium-tungsten alloy, an aluminum-silicon alloy, an aluminum-copper-silicon alloy, silicon oxide, and silicon nitride. It should be noted that, as the substrate to be used (substrate to be processed), there may be used a substrate whose adhesion property to a photocurable composition is improved by virtue of a surface treatment such as a silane coupling treatment, a silazane treatment, or a film formation of an organic thin film.

As a method of placing the photocurable composition of the present invention on the substrate to be processed, there may be used, for example, an ink jet method, a dip coating method, an air knife coating method, a curtain coating method, a wire bar coating method, a gravure coating method, an extrusion coating method, a spin coating method, or a slit scan method. It should be noted that the thickness of the layer to be subjected to shape transfer (applied film) varies depending on the application, and is, for example, 0.01 µm to 100.0 µm.

<Mold Contact Step (FIGS. 2B and 2C)>

Next, the step of bringing the mold into contact with the applied film formed of the photocurable composition 1 formed in the preceding step (placing step) (contact step, FIG. 2B, FIG. 2C) is performed. It should be noted that the step is also referred to as a mold contact step because the mold 3 is considered as a stamp. When the mold 3 is brought into contact with the photocurable composition 1 (layer to be subjected to shape transfer) in the step (FIG. 2B), a recessed portion of the fine pattern formed on the mold 3 is filled with (part of) the applied film 11 (FIG. 2C).

The mold 3 to be used in the contact step needs to be constituted of an optically transparent material in consideration of the next step (light irradiation step). Glass, quartz, an optically transparent resin such as a PMMA or a polycarbonate resin, a transparent metal-deposited film, a flexible film made of a polydimethylsiloxane or the like, a photo-cured film, and a metal film can be given as specific examples of the constituent material for the mold 3. It should be noted that when an optically transparent resin is used as the constituent material for the mold 3, a resin that does not dissolve in the solvent in the photocurable composition 1 needs to be selected.

The mold 3 to be used in the method of manufacturing a photo-cured product of the present invention may be subjected to a surface treatment for improving releasability between the photocurable composition 1 and the surface of the mold 3 before use. A method for the surface treatment is, for example, a method involving applying a mold release agent to the surface of the mold to form a mold release agent layer before the performance of the mold contact step. Here, examples of the mold release agent to be applied to the surface of the mold include a silicone-based mold release agent, a fluorine-based mold release agent, a polyethylene-based mold release agent, a polypropylene-based mold release agent, a paraffin-based mold release agent, a montan-based mold release agent, and a carnauba-based mold release agent. For example, a commercially available application type mold release agent such as an OPTOOL DSX manufactured by Daikin Industries, Ltd. can be suitably used. It should be noted that one kind of those mold release agents may be used alone, or two or more kinds thereof may be used in combination. Of those, a fluorine-based mold release agent is particularly preferred.

The pressure to be applied to the photocurable composition 1 when the mold 3 is brought into contact with the photocurable composition 1 as illustrated in FIG. 2B in the mold contact step is typically 0.1 MPa to 100 MPa, though the pressure is not particularly limited. Of such range, a pressure of 0.1 MPa to 50 MPa is preferred, a pressure of 0.1 MPa to 30 MPa is more preferred, and a pressure of 0.1 MPa to 20 MPa is still more preferred. In addition, the time period for which the mold 3 is brought into contact with the layer 1 to be subjected to shape transfer in the contact step is typically 0.1 second to 600 seconds, preferably 0.1 second to 300 seconds, more preferably 0.1 second to 180 seconds, particularly preferably 0.1 second to 120 seconds, though the time period is not particularly limited.

In addition, the mold contact step can be performed under any one of the following conditions: under an air atmosphere, under a reduced-pressure atmosphere, and under an inert gas atmosphere. A reduced-pressure atmosphere or an inert gas atmosphere is preferred because an influence of oxygen or moisture on the photo-curing reaction can be prevented. When the contact step is performed under an inert gas atmosphere, specific examples of the inert gas to be used include nitrogen, carbon dioxide, helium, argon, various chlorofluorocarbon gases, and a mixed gas thereof. When this step (contact step) is performed under a specific gas atmosphere including an air atmosphere, a preferred pressure is 0.0001 atmosphere to 10 atmospheres. It should be noted that a reduced-pressure atmosphere or an inert gas atmosphere is preferred because an influence of oxygen or moisture on the photo-curing reaction can be prevented.

In the present invention, a condensable gas may be used as an atomospheric gas. That is, the present invention includes a method of manufacturing a film including performing a step of bringing the photocurable composition and the mold into contact with each other in a condensable gas atmosphere or a mixed gas atmosphere of the condensable gas and noncondensable gas.

In the present invention, the condensable gas is not only a gas which is present as a normal gas under a temperature condition and a pressure condition in a manufacturing apparatus of the photocurable composition having desired pattern but also a gas which is condensed (liquefied) under a predetermined condition. The detail of the predetermined condition will be explained below.

Such condensable gas is a gas having a boiling point of −10° C. to 23° C. or a vapor pressure of 0.1 to 0.4 MPa at a room temperature. Of those, a condensable gas having a boiling point of 10° C. to 23° C. is particularly preferable.

If the gas has a vapor pressure of 0.1 to 0.4 MPa, the gas is easily condensed by a capillary pressure generated when the photocurable composition 1 enters into a gap between the substrate 2 and the mold 3, or the concave portion on the mold 3, and is liquefied, resulting in that bubbles disappear.

When the vapor pressure is higher than 0.4 MPa, the effect of disappearance of bubbles cannot be sufficiently obtained, which is not preferable. On the other hand, when the vapor pressure at an ordinary temperature is smaller than 0.1 MPa, reduction of pressure is needed and the apparatus comes to be complicated, which is not preferable.

Note that an imprint region of a ultraviolet curing type imprint apparatus is ordinarily used at a room temperature. When the condensable gas is a gas having a boiling point lower than a temperature of the imprint region, the gas comes to be a gas at imprinting by controlling the temperature. As a result, the apparatus does not come to be complicated, which is preferable. Here, a "room temperature" is defined to be 20° C. to 25° C.

The condensable gas specifically includes Freon frons such as chlorofluorocarbon (CFC), fluorocarbon (FC) and hydrochlorofluorocarbon (HCFC), hydrofluorocarbon (HFC), hydrofluoroether (HFE). Particularly, 1,1,1,3,3-pentafluoropropane ($CHF_2CH_2CF_3$, HFC-245fa, PFP) is preferable. PFP has a vapor pressure of 0.1 MPa at 23° C. which is around a room temperature and has a boiling point of 15° C.

A sole condensable gas or a mixture of two or more kinds of condensable gases may be used. Further, the condensable gas(es) may be used at a state where the gas(es) is/are mixed with a noncondensable gas such as air, nitrogen, carbon dioxide, herium and argon.

<Light Irradiation Step (FIG. 2D)>

Next, the applied film 11 is irradiated with light through the mold 3 (FIG. 2D). In the step, the applied film 11 is cured with the applied light to form the photo-cured product 12.

In this step (light irradiation step), the photocurable composition of the present invention that receives light having a predetermined wavelength undergoes the following chemical reactions (d1) and (d2):

(d1) the polymerization reaction of the polymerizable compound; and
(d2) the photolysis reaction of the photosensitive gas generating agent (gas generation reaction).

Although the chemical reactions (d1) and (d2) competitively occur, the reaction rate of the reaction (d1) (the reaction rate of the polymerization reaction) is preferably controlled so as to be higher than the reaction rate of the reaction (d2) (the reaction rate of the gas generation reaction) in the present invention. This is because of the following reason. When the reaction rate of the reaction (d1) is set to be higher than the reaction rate of the reaction (d2), the gas intensively aggregates at the interface between the mold 3 and the photocurable composition 1 after the curing of the polymerizable compound as the component (A), and hence a mold release force-reducing effect can be obtained. In contrast, when the reaction rate of the reaction (d2) is higher than the reaction rate of the reaction (d1), the following problem arises: the gas effervesces in the cured film 12 or the mold release force-reducing effect is not obtained.

By the way, when the photosensitive gas generating agent as the component (C) is incorporated into the photocurable composition in the method of manufacturing a film involving utilizing a photo-imprint method, the mold release force becomes smaller as the amount of the gas generated from the photosensitive gas generating agent increases. The foregoing leads to the fact that the mold release force becomes smaller as the light irradiation time lengthens. In the present invention, the gas generation promotor as the component (D) is further incorporated in addition to the photosensitive gas generating agent as the component (C). Accordingly, as illustrated in FIG. 1, the gas immediately aggregates to the gas generation layer formed of the gas generation promotor formed at the interface between the mold 3 and the photocurable composition 1. Accordingly, the light irradiation time needed for obtaining a required mold release force becomes relatively short. Therefore, the method of manufacturing a film of the present invention has high productivity.

Here, the light with which the photocurable composition 1 constituting the applied film 11 is irradiated is selected in accordance with the sensitivity wavelength of the photocurable composition 1. Specifically, it is preferred that ultraviolet light having a wavelength of about 150 nm to 400 nm, an X-ray, an electron beam, or the like be appropriately selected and used. Here, many of the compounds commercially available as curing aids (photopolymerization initiators) have sensitivity to the ultraviolet light. Accordingly, the light with which photocurable composition 1 is irradiated (irradiation light 4) is particularly preferably the ultraviolet light. Here, examples of the light source of ultraviolet light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a $F_2$ excimer laser. Of those, an ultra-high pressure mercury lamp is particularly preferred. The number of the light source to be used may be one or more. Further, when the photocurable composition 1 is irradiated with light, the entire surface thereof may be irradiated with light, or a part of the surface thereof may be irradiated with light.

In addition, when the layer to be subjected to shape transfer cures also with heat, heat curing may be further performed. When the heat curing is performed, a heating atmosphere, a heating temperature, and the like are not particularly limited. For example, under an inert atmosphere or under reduced pressure, the photocurable composition 1 can be heated at a temperature in the range of 40° C. to 200° C. In addition, a hot plate, an oven, a furnace, or the like can be used upon heating of the layer 1 to be subjected to shape transfer.

<Mold Release Step (FIG. 2E)>

Next, the step of releasing the mold 3 from the photo-cured product 12 to form a cured film having a predetermined pattern shape on the substrate 2 (mold release step, FIG. 2E) is performed. The step (mold release step) is the step of releasing the mold 3 from the photo-cured product 12, and the reverse pattern of the fine pattern formed on the mold 3 in the preceding step (light irradiation step) is obtained as the pattern of the photo-cured product 12.

A method of releasing the mold 3 from the photo-cured product 12 is not particularly limited as long as part of the photo-cured product 12 does not physically fracture during the release, and various conditions for the release and the like are also not particularly limited. For example, the mold 3 may be released as described below. The substrate to be processed (substrate 2) is fixed and the mold 3 is moved so that the mold may go away from the substrate to be processed. Alternatively, the mold 3 may be released as described below. The mold is fixed and the substrate to be processed is moved so that the substrate may go away from the mold. Alternatively, the mold may be released by pulling both the substrate and the mold in directions diametrically opposed to each other.

<Remaining Film Removal Step (FIG. 2F)>

Although the cured film to be obtained when the mold release step is performed has a specific pattern shape, part of the film may exist as a remaining film even in a region except the region where the pattern shape is formed. In view of the foregoing, the step of removing the photo-cured film (remaining film) remaining in a region from which the photo-cured product should be removed out of the pattern shape (remaining film removal step, FIG. 2F) is performed.

Here, a method of removing the remaining film is, for example, a method involving removing the film (remaining film) remaining in a recessed portion of the photo-cured product 12 by etching to expose the surface of the substrate 2 in the recessed portion of the pattern.

When the etching is utilized, a specific method therefor is not particularly limited and a desired pattern shape can be formed by a conventionally known method, for example, by performing dry etching. A conventionally known dry etching apparatus can be used in the dry etching. In addition, a source gas at the time of the dry etching is appropriately selected depending on the elemental composition of a film to be etched. For example, a gas containing an oxygen atom such as $O_2$, CO, or $CO_2$, an inert gas such as He, $N_2$, or Ar, a chlorine-based gas such as $Cl_2$ or $BCl_3$, or a gas of $H_2$ or $NH_3$ can be used. It should be noted that those gases can be used as a mixture.

The photo-cured product 12 having a desired irregular pattern shape (pattern shape attributable to the irregular shape of the mold 3) can be obtained by the manufacturing process including the steps (1) to (5). Here, when the substrate 2 is processed by utilizing the photo-cured product 12, the step of processing the substrate to be described later is further performed in some cases.

Meanwhile, the resultant photo-cured product 12 can be utilized as an optical member (the case where the product is used as one member of the optical member is included). In such case, the photo-cured product 12 can be provided as an optical member having at least the substrate 2 and the photo-cured product 12 placed on the substrate 2.

<Substrate Processing Step (FIG. 2G)>

The photo-cured product 12 having a desired irregular pattern shape obtained by the manufacturing method of the present invention can be utilized as, for example, a film for an interlayer insulating film in an electronic component typified by a semiconductor element such as an LSI, a system LSI, a DRAM, an SDRAM, an RDRAM, or a D-RDRAM. Meanwhile, the photo-cured product 12 can also be utilized as a resist film at the time of the manufacture of a semiconductor element.

When the photo-cured product 12 is utilized as a resist film, specifically, part of the substrate whose surface has been exposed by the etching step (region represented by reference numeral 20) is subjected to, for example, etching or ion implantation as illustrated in FIG. 2G. It should be noted that at this time, the photo-cured product 12 functions as a mask. Thus, a circuit structure (not shown) based on the pattern shape of the photo-cured product 12 can be formed on the substrate 2. Thus, a substrate with a circuit to be utilized in a semiconductor element or the like can be manufactured. It should be noted that an electronic component is formed by providing an electronic member for the substrate with a circuit.

It should be noted that when the substrate with a circuit or the electronic component is produced, the pattern of the photo-cured product may be finally removed from the processed substrate, but such a constitution that the pattern is left as a member for constituting an element is also preferred.

Hereinafter, the present invention is described in more detail by way of examples, but the technical scope of the present invention is not limited to the examples to be described below.

EXAMPLE 1

(1) Photocurable Composition

First, the following component (A), component (B), component (C), and component (D) were compounded to provide a mixed solution.

(1-1) Component (A): trimethylolpropane triacrylate (manufactured by Sigma-Aldrich Co. LLC.):
100 parts by weight;

(1-2) Component (B): 2-hydroxy-2-methyl-1-phenyl-propan-1-one (Darocur 1173, manufactured by Ciba Japan):
3 parts by weight;

(1-3) Component (C): 2,2'-azobis-(N-butyl-2-methylpropionamide) (VAm-110, manufactured by WAKO Pure Chemical Industries, Ltd.):
15 parts by weight; and (1-4) Component (D): hexaethylene glycol mono(1H,1H-perfluoroheptyl) ether shown below:
2 parts by weight $F(CF_2)_6CH_2(OCH_2CH_2)_6OH)$ Next, the resultant mixed solution was filtered with a filter made of an ultra-high molecular weight polyethylene whose mesh was 0.2 µm. Thus, a photocurable composition (a-1) of this example (Example 1) was prepared.

(2) Applying Step 4.8 Microliters of a droplet of the photocurable composition (a-1) were dropped on a 200-mm silicon wafer having formed thereon an adhesion-promoting layer having a thickness of 60 nm as an adhesion layer with a dispenser.

(3) Mold Contact Step and Light Irradiation Step

Next, the periphery of the droplet was replaced with a nitrogen atmosphere. After that, a mold made of synthetic quartz on which no pattern had been formed was brought into contact with the droplet. Here, the area of contact between the droplet and the mold was about 50 mm². Next, the photocurable composition was irradiated with light having a wavelength of 365 nm and an illumination intensity of 19.1 mW/cm² through the mold for a certain time period. Thus, the photocurable composition was cured and a gas was generated from the photosensitive gas generating agent as the component (C).

(4) Mold Release Step

Next, the quartz mold was lifted, whereby the mold was released from the photo-cured product. A cured film was obtained through the foregoing steps. It should be noted that the average thickness of the resultant film was about 100 µm.

(5) Evaluation of Photo-Cured Product (Mold Release Force Measurement)

A force needed for the mold release at the time of the mold release step was measured with a load cell. It should be noted that at the time of the measurement, the measurement (mold release force measurement) was performed ten times under the same conditions and the average of the measured values was defined as the mold release force. Table 1 shows the results of the measurement.

COMPARATIVE EXAMPLE 1

A photocurable composition (b-1) was prepared by the same method as that of Example 1 except that in Example 1, the component (D) was not added. In addition, a cured film was obtained with the photocurable composition (b-1) by the same method as that of Example 1.

Here, a force needed for the mold release at the time of the mold release step was measured with a load cell in the same manner as in Example 1. Table 2 shows the results of the measurement.

TABLE 1

| Exposure time [sec] | Mold release force [N] |
|---|---|
| 6 | 14 |
| 20 | 17 |
| 40 | 19 |
| 100 | 2.0 |
| 200 | 1.2 |
| 600 | 0.7 |

TABLE 2

| Exposure time [sec] | Mold release force [N] |
|---|---|
| 6 | 81 |
| 100 | 63 |
| 200 | 46 |
| 600 | 13 |

In the method of manufacturing a film based on a UV nanoimprint method, the exposure time needed for obtaining a required mold release force (15 N or less) was 40 seconds to 100 seconds in Example 1. In contrast, the exposure time was 200 seconds to 600 seconds in Comparative Example 1. The foregoing results showed that upon production of a film having a desired pattern shape with a photocurable composition containing a photosensitive gas generating agent through the utilization of a photo-imprint method, the incorporation of a gas generation promotor into the photocurable composition like the present invention improved productivity.

EXAMPLE 2

(1) Photocurable Composition
First, the following component (A), component (B), component (C), and component (D) were compounded to provide a mixed solution.
(1-1) Component (A): 94 parts by weight in total
<A-1> Isobornyl acrylate (manufactured by KYOEISHA CHEMICAL Co., LTD., trade name: IB-XA):
61.6 parts by weight
<A-2> (2-Methyl-2-ethyl-1,3-dioxolan-4-yl)methyl acrylate (manufactured by OSAKA ORGANIC CHEMICAL INDUSTRY LTD., trade name: MEDOL-10):
10 parts by weight
<A-3> Hexanediol diacrylate (manufactured by OSAKA ORGANIC CHEMICAL INDUSTRY LTD., trade name: Viscoat #230):
22.4 parts by weight
(1-2) Component (B): 3 parts by weight Darocur 1173 (manufactured by BASF)
(1-3) Component (C): 15 parts by weight 2,2'-Azobis(N-butyl-2-methylpropionamide) (VAm-110, manufactured by Wako Pure Chemical Industries, Ltd.):
15 parts by weight
(1-4) Component (D): 1.1 parts by weight Pentadecaethylene glycol mono(1H,1H,2H,2H-perfluorooctyl) ether ($F(CF_2)_6CH_2CH_2$ $(OCH_2CH_2)_{15}OH$, manufactured by DIC):
1.1 parts by weight
Next, the resultant mixed solution was filtered with a filter made of an ultra-high molecular weight polyethylene whose mesh was 0.2 μm. Thus, a photocurable composition (a-2) of this example (Example 2) was prepared.
(2) Applying Step
16 Microliters of the composition (a-2) of Example 2 were dropped on a 4-inch silicon wafer having formed thereon an adhesion-promoting layer having a thickness of 60 nm as an adhesion layer with a micropipette. It should be noted that the average thickness of a film obtained after a mold release step to be described later was about 10 μm.
(3) Mold Contact Step and Light Irradiation Step
Next, a 40-mm by 40-mm quartz mold which had not been subjected to any surface treatment and on which no pattern had been formed was impressed on the silicon wafer.
A UV light source EXECURE 3000 (manufactured by HOYA CANDEO OPTRONICS CORPORATION) provided with a 200-W mercury-xenon lamp was used as an irradiation light source. An interference filter VPF-50C-10-25-36500 (manufactured by SIGMA KOKI CO., LTD.) was placed between the light source and the quartz mold. An illumination intensity directly below the quartz mold was 100 mW/cm$^2$ at a wavelength of 365 nm.
Alight irradiation step was performed for 60 seconds under the foregoing conditions. Thus, the photocurable composition (a-2) was cured and a gas was generated from the photosensitive gas generating agent as the component (C).
(4) Mold Release Step
Next, the quartz mold was lifted, whereby the mold was released from the photo-cured product. A cured film was obtained through the foregoing steps. It should be noted that the average thickness of the resultant film was about 10 μm.
(5) Evaluation of Photo-Cured Product (Mold Release Force Measurement)
A force needed for the mold release at the time of the mold release step was measured with a load cell. As a result, the mold release force was almost zero (equal to or less than the noise level of the load cell).

COMPARATIVE EXAMPLE 2

A photocurable composition (b-2) was prepared by the same method as that of Example 2 except that in Example 2, the component (D) was not added. In addition, a cured film was obtained with the photocurable composition (b-2) by the same method as that of Example 2.
Here, a force needed for the mold release at the time of the mold release step was measured with a load cell in the same manner as in Example 2. The mold release force measurement was performed four times under the same conditions. The average value of the mold release force determined from second to fourth measurements was 111 N.
In the method of manufacturing a film based on a UV nanoimprint method, the exposure time needed for obtaining a required mold release force (15 N or less) was 60 seconds or less in Example 2. In contrast, the exposure time was required to be 60 seconds or more in Comparative Example 2. The foregoing results showed that upon production of a film having a desired pattern shape with a photocurable composition containing a photosensitive gas generating agent through the utilization of a photo-imprint method, the incorporation of a gas generation promotor into the photocurable composition like the present invention improved productivity.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-209327, filed on Sep. 24, 2012, which is hereby incorporated by reference herein in its entirety.

The invention claimed is:
1. A photocurable composition to be used for manufacturing a film having a predetermined pattern shape by curing the photocurable composition with light under a state where the photocurable composition is brought into contact with a mold having concavo-convex on a surface thereof, the photocurable composition comprising:
  a polymerizable compound;
  a photopolymerization initiator;
  a photosensitive gas generating agent for generating a gas through light stimulation, which does not generate a base through a photoreaction; and
  a gas generation promoter for increasing an aggregation rate of the gas generated from the photosensitive gas generating agent at an interface between the mold and the photocurable composition, wherein the gas generation promoter comprises a fluorine atom-containing surfactant that is free of a polymerizable substituent.

2. The photocurable composition according to claim 1, wherein:
the photosensitive gas generating agent is contained at 1 wt % to 15 wt % with respect to a total weight of the polymerizable compound; and
the gas generation promoter is contained at 0.005 wt % to 3 wt % with respect to the total weight of the polymerizable compound.

3. The photocurable composition according to claim 1, wherein the gas generation promoter comprises a compound represented by formula (1):

$$Rf_1\text{-}Rc_1\text{-}X_1 \qquad (1),$$

wherein, in the formula (1), $Rf_1$ represents a monovalent functional group constituted of a fluorine atom and a carbon atom, $Rc_1$ represents a divalent functional group constituted of a hydrogen atom, an oxygen atom, and a carbon atom, and $X_1$ represents a hydroxyl group, a carboxyl group, a sulfo group, an amino group, or an alkoxy group.

4. The photocurable composition according to claim 1, wherein the gas generation promoter comprises a compound represented by formula (2):

$$Rf_1\text{-}Rc_1\text{-}Rf_2 \qquad (2),$$

wherein, in the formula (2), $Rf_1$ and $Rf_2$ each represent a monovalent functional group constituted of a fluorine atom and a carbon atom, and $Rf_1$ and $Rf_2$ may be identical to or different from each other, and $Rc_1$ represents a divalent functional group constituted of a hydrogen atom, an oxygen atom, and a carbon atom.

5. The photocurable composition according to claim 1, wherein the gas generation promoter comprises a compound represented by formula (3):

$$X_1\text{-}Rc_1\text{-}Rf_3\text{-}Rc_2\text{-}X_2 \qquad (3),$$

wherein, in the formula (3), $Rf_3$ represents a divalent functional group constituted of a fluorine atom and a carbon atom, $Rc_1$ and $Rc_2$ each represent a divalent functional group constituted of a hydrogen atom, an oxygen atom, and a carbon atom, and $Rc_1$ and $Rc_2$ may be identical to or different from each other, and $X_1$ and $X_2$ each represent a hydroxyl group, a carboxyl group, a sulfo group, an amino group, or an alkoxy group, and $X_1$ and $X_2$ may be identical to or different from each other.

6. The photocurable composition according to claim 1, wherein the gas generation promoter comprises a compound represented by formula (4):

$$F(CF_2)_6CH_2CH_2(OCH_2CH_2)_{15}OH \qquad (4).$$

7. The photocurable composition according to claim 1, wherein the gas generation promoter comprises a compound represented by formula (5):

$$F(CF_2)_6CH_2(OCH_2CH_2)_6OH \qquad (5).$$

8. A method of manufacturing a film, comprising:
placing the photocurable composition according to claim 1 on a substrate;
bringing the photocurable composition and a mold into contact with each other;
irradiating the photocurable composition with light; and
releasing the photocurable composition and the mold from each other after the irradiating,
wherein a film having a predetermined pattern shape is obtained on the substrate.

9. The method of manufacturing a film according to claim 8, wherein a surface of the mold in contact with the photocurable composition comprises quartz.

10. The method of manufacturing a film according to claim 8, wherein:
the irradiating comprises irradiating the photocurable composition with light through the mold; and
the mold has concavo-convex on a surface thereof.

11. A method of manufacturing a substrate with a circuit, comprising performing one of etching and ion implantation based on a pattern shape of a film obtained by the method according to claim 8 to form a circuit structure on the substrate based on the pattern shape.

12. An optical member comprising:
a substrate; and
a film placed on the substrate,
wherein the film comprises a film manufactured by the method according to claim 8.

13. The method of manufacturing a film according to claim 8, wherein the bringing the photocurable composition and the mold into contact with each other is performed in a condensable gas atmosphere.

14. The method of manufacturing a film according to claim 8, wherein the bringing the photocurable composition and the mold into contact with each other is performed in an atmosphere of a mixed gas of a condensable gas and a noncondensable gas.

15. The photocurable composition according to claim 1, wherein the photosensitive gas generating agent comprises at least one compound selected from the group consisting of an azo-based compound, a diazonium salt-based compound, an azido-based compound, a diazonaphthoquinone-based compound, and a diazomethanesulfonic acid-based compound.

* * * * *